United States Patent [19]

Spencer et al.

[11] Patent Number: 4,957,773

[45] Date of Patent: Sep. 18, 1990

[54] DEPOSITION OF BORON-CONTAINING FILMS FROM DECABORANE

[75] Inventors: James T. Spencer, Syracuse; Peter A. Dowben, Dewitt; Yoon G. Kim, Syracuse, all of N.Y.

[73] Assignee: Syracuse University, Syracuse, N.Y.

[21] Appl. No.: 309,213

[22] Filed: Feb. 13, 1989

[51] Int. Cl.$^5$ .................... B05D 5/12; C23C 16/34; C23C 16/14; C23C 16/48

[52] U.S. Cl. .................... 427/39; 427/38; 427/53.1; 427/54.1; 427/255.1; 427/255.2; 427/43.1

[58] Field of Search ............... 427/38, 39, 53.1, 54.1, 427/255.1, 255.2, 43.1

[56] References Cited

U.S. PATENT DOCUMENTS

| | | |
|---|---|---|
| 3,152,006 | 2/1964 | Basche . |
| 3,499,799 | 5/1970 | Patterson . |
| 3,692,556 | 10/1972 | Branovich et al. . |
| 3,791,852 | 9/1974 | Bunshah . |
| 3,811,930 | 8/1974 | Kuehl et al. . |
| 4,297,387 | 1/1981 | Beale . |
| 4,412,899 | 3/1983 | Beale . |
| 4,415,420 | 5/1983 | Beale . |
| 4,522,849 | 7/1985 | Lewandowski . |
| 4,622,236 | 6/1986 | Morimoto et al. . |
| 4,655,893 | 4/1987 | Beale . |
| 4,656,052 | 4/1987 | Satou et al. . |
| 4,695,476 | 9/1987 | Feild, Jr. ................... 427/6 |
| 4,714,625 | 12/1987 | Chopra et al. . |
| 4,762,729 | 8/1988 | Hirano et al. ............... 427/38 |
| 4,818,625 | 4/1989 | Lavendel et al. .......... 427/248.1 |

FOREIGN PATENT DOCUMENTS

| | | |
|---|---|---|
| 1152091 | 8/1983 | Fed. Rep. of Germany ...... 423/298 |
| 58-133368 | 8/1983 | Japan . |
| 58-168281 | 10/1983 | Japan . |

*Primary Examiner*—Norman Morgenstern
*Assistant Examiner*—Margaret Bueker
*Attorney, Agent, or Firm*—Wall and Roehrig

[57] ABSTRACT

Depopsition of a boron nitride film is carried out by introducing decaborane and dry nitrogen or ammonia into a plasma-assisted chemical vapor deposition chamber. The nitrogen or ammonia partial pressure should provide an excess over the decarborane pressures for example 200 milliTorr of $N_2$ or $NH_3$ and 50 MilliTorr of $B_{10}H_{14}$. Other film layers can also be produced starting from decaborane.

12 Claims, 1 Drawing Sheet

U.S. Patent
Sep. 18, 1990
4,957,773
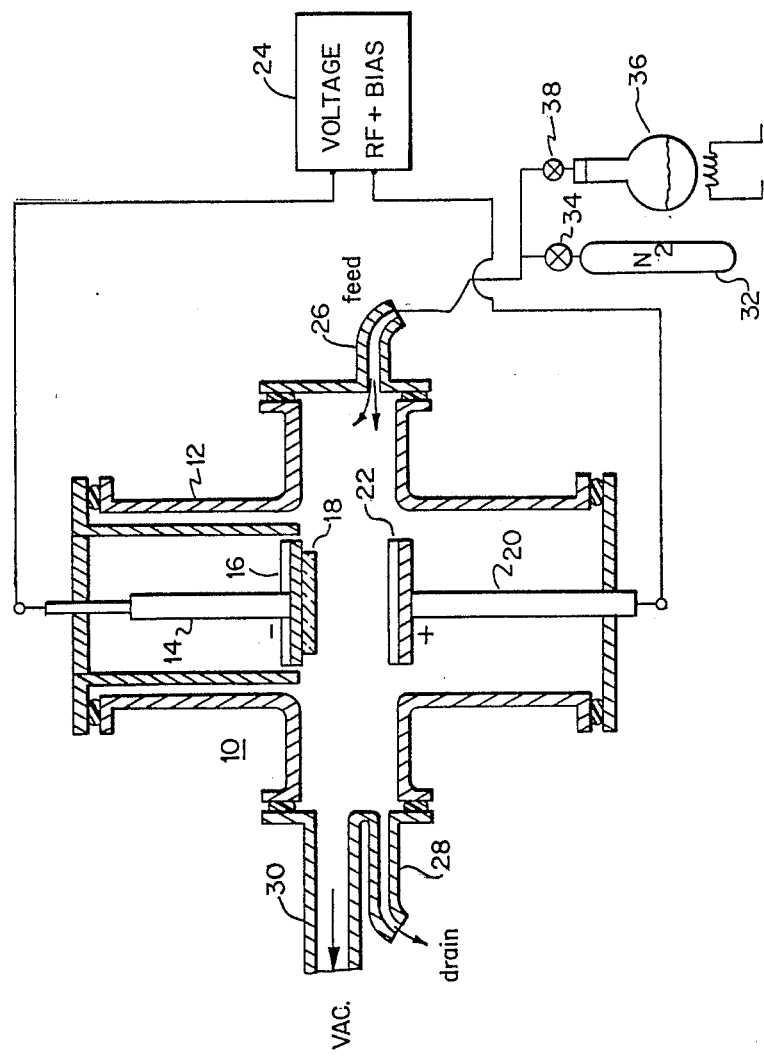

DEPOSITION OF BORON-CONTAINING FILMS FROM DECABORANE

BACKGROUND OF THE INVENTION

This invention relates to a process for deposition of films of boron nitrides or other binary boron films, such as boron phosphide, boron carbide, boron silicide, boron arsenide, etc. as well as to the deposition and subsequent doping of boron. The invention is more particularly directed to deposition, such as by plasma assisted deposition of BN films or the like from a mixture of decaborane and another gas such as nitrogen, ammonia, methane, silane, etc. to combine with boron in the film. Boron nitride is useful in many applications, and particularly in semiconductor electronics, because of its high resistivity, insulating, and dielectric properties. Desirably, boron nitride should be deposited in cubic form which is similar to the diamond lattice structure of silicon, gallium arsenide, or zinc sulfide. Boron nitride coatings are also useful as corrosion resistant, anti-reflective hard durable coatings in a number of applications.

Boron carbide, boron phosphide, boron arsenide, and other binary layers based on boron and another element each have particular utilities which are well known and documented.

Several previous processes for depositing boron nitride films are described, for example, in U.S. Pat. Nos. 4,714,625; 4,656,052; 4,622,236; 4,412,899; 4,415,420; 4,297,387; 3,692,566; 3,499,799; and 3,152,066.

In U.S. Pat. No. 4,522,849 is disclosed a process for coating a quartz substrate with boron nitride. In that process ammonia and diborane gases are mixed and flowed past the quartz substrate, which has been heated to about 1000° C. The diborane and ammonia gases react to produce the boron nitride film. Other processes employ other starting vapors; U.S. Pat. No. 4,714,625 describes mixing of boric acid and ammonia to form a boron nitride layer.

None of these previous techniques is adaptable to depositing boron nitride and boron in patterns. However, it would be highly desirable to do this so that the technique can be used in very large scale circuit integration (VLSI) as a single-step deposition process in forming insulation, barriers, or resistors. Such a technique would make more reliable, more highly integrated electronic devices at a lower cost.

OBJECTS AND SUMMARY OF THE INVENTION

It is an object of this invention to provide an improved method of depositing boron nitride on a substrate.

It is another object of this invention to deposit a film in a controlled precise manner.

It is a further object of this invention to provide a boron nitride process that avoids drawbacks of processes that rely on diborane.

According to one aspect of this invention decaborane ($B_{10}H_{14}$) is combined with dry nitrogen ($N_2$) or anhydrous ammonia ($NH_3$) and introduced into a reaction chamber, such as an RF plasma reactor which contains a substrate to be coated. Thin film deposition of boron nitride (BN) is carried out by applying a standard radio frequency current, e.g. 20 watts power output at 13.56 KHz with a 90 volt d.c. bias. There should be a substantial excess of the nitrogenous gas ($N_2$ or $NH_3$) as compared with the decaborane. To deposit $B_4N$, the relative partial pressure of decaborane can be increased. Favorably for depositing cubic BN, the respective partial pressures for nitrogen and decaborane can be 200 microns (200 milliTorr) and 50 microns (50 milliTorr).

Because of the inherent stability of the decaborane as compared with other boron compounds, such as diborane ($B_2H_6$), photolytic and pyrolytic deposition is possible permitting boron nitride film to be deposited in coatings with very small, highly precise spatial resolution. This opens the door to BN or $B_4N$ coating applications not possible with diborane.

In addition to BN coatings, this technique can be used to deposit boron carbide, boron phosphide, boron silicide, boron germanide, and/or boron arsenide films, starting with decaborane admixed with gases such as methane ($CH_4$), phosphane ($PH_3$), silane ($SiH_4$), germane ($GeH_4$) and arsane ($AsH_3$), for example. Other gases such as higher carbon alkanes, ethylene, silol, etc., can also be employed.

Pure boron can also be deposited, for example by irradiating the substrate in the presence of decaborane with ultraviolet photons in the wavelength range of 200 nm to 532 nm. Boron can be deposited this way as a dopant on N-type semiconductor material to create a PN junction with precisely controlled geometry. This technique permits the boron-doped region to be dimensioned as small as 20 microns across.

The above and many other objects, features, and advantages of this invention will be more fully understood from the ensuing description of one embodiment of the invention, with reference to the accompanying Drawing.

BRIEF DESCRIPTION OF THE DRAWING

The sole FIGURE of Drawing is a schematic view of a plasma reactor in which the process of this invention is carried out according to one embodiment of the invention.

DETAILED DESCRIPTION OF THE PREFERRED EMBODIMENT

With reference to the sole drawing FIGURE, a plasma assisted chemical vapor deposition (PACVD) chamber 10 is here comprised of a flanged cross 12 having upper and lower vertical arms, horizontal arms, flange plates, and seal rings, as is generally practiced. An upper pedestal 14 depends within a vertical arm to a substrate-retaining plate 16 which holds a substrate 18 to be coated e.g., with a cubic boron nitride deposition. The plate 16 can include a cartridge heater. The plate 16 here serves as cathode. Another pedestal 20 rises within the lower arm and supports a plate 22 that serves as anode. A standard radio-frequency generator unit 24 applies an r.f. current to the plates 16 and 22, with a 90 volt d.c. bias. Here the unit 24 has a frequency of 13.56 KHz and an output power of 20 watts, as is standard.

A gas inlet supply tube 26 injects reaction gases through one horizontal arm of the cross 12, while a reactor gauge outlet tube 28 and a vacuum line 30 are coupled to the opposite horizontal arm. The line 30 is connected to a vacuum pump, not shown. A gas source 32, here a tank of $N_2$ is coupled through a regulator 34 to the inlet tube 26, and a container 36 of decaborane, with a suitable pressure regulator 38, is likewise coupled to the tube 26. The regulators 34 and 38 are suitably controlled so that the nitrogen gas and decaborane vapor are introduced into the reactor at respective partial pressures of about $200 \times 10^{-3}$ mm Hg (200 milliTorr) and $50 \times 10^{-3}$ mm Hg (50 milliTorr). To produce cubic BN, it is necessary that there be an excess of the nitrogen-bearing gas—e.g., $N_2$ or $NH_3$—relative to the decaborane.

The resulting BN coating can be applied uniformly on the substrate 18 or, for example, can be applied in patterns using a direct writing technique. The BN film or coating can provide a hard, protective coat for semiconductor devices or integrated circuits. Also, because of the favorable insulating properties and thermal expansion coefficient, boron nitride can be used as an insulating layer for separating active semiconducting and conducting layers in very large scale integration (VLSI).

EXAMPLE I

A PACVD chamber 10 containing a silicon substrate was maintained at a chamber pressure of 7.2 microns. An outgas rate of 0.5 per minute was observed. This cartridge heater associated with the substrate retaining plate 16 was turned on and a standard RF voltage of 13.56 KHz and 20 watts was applied. Dry nitrogen was introduced at a pressure of 300 microns, while decaborane was introduced at a pressure of 20 microns. The pressure was permitted to stabilize and plasma deposition took place for a period of about four-and-one-half hours. Then, the temperature was gradually reduced and the reactor was purged with dry nitrogen.

The above process was repeated with several sample substrates for different periods. The resulting boron nitride films were found to be uniform and an opaque whitish color. The thickness of the coating could be varied in a range of at least 50 nanometers to 25 microns. The films had a hydrogen content no greater than 6.6%, which is far better than 13 to 16% obtained in other deposition methods.

Similar results were found when ammonia, rather than nitrogen, was used as the gas that mixed with decaborane. In all cases, hydrogen content of the film was no more than about 6.6 percent.

EXAMPLE II

Pure decaborane gas was introduced into a reactor containing a silicon substrate. A pattern of closely spaced dots was illuminated onto the substrate using ultraviolet light of a wavelength of 300 nm. The reactor was purged with dry nitrogen, and the substrate removed and analyzed with a scanning electron microscope. In this case, islands of pure boron were deposited at a desired thickness of about 10 microns, and with a diameter of substantially 20 microns. Deposits of boron outside these islands appeared to be insignificant. The hydrogen content was about 6.6 percent.

While the invention has been described here with reference to one preferred embodiment, it should be recognized that the invention is not delimited by that embodiment, which is offered as an example. Rather many modifications and variations would present themselves to those skilled in the art without departing from the scope and spirit of this invention, as defined in the appended claims.

What is claimed is:

1. A process for depositing a boron nitride film onto a suitable substrate comprising:
    supplying into a chamber that contains the substrate a gaseous mixture of decaborane and a nitrogen-based gas whose molecules contain at least one nitrogen atom, wherein said nitrogen-based gas is provided at a partial pressure that is several times as high as the partial pressure of said decaborane, and
    energizing the gaseous mixture in the chamber sufficiently to disassociate the nitrogen atoms from said molecules and to disassociate boron atoms from the decaborane, which then combine as said boron nitride film on said substrate.

2. The process of claim 1 wherein said nitrogen-based gas is selected from the group that consists of $N_2$, $NH_3$ and mixtures thereof.

3. The process of claim 1 wherein said nitrogen-based gas and said decaborane are supplied at partial pressure of approximately 200 and 50 milliTorr, respectively.

4. The process of claim 1 wherein said chamber is an RF plasma reactor and said energizing is carried out by applying an RF current to the chamber while supplying said gaseous mixture thereto.

5. A process for depositing a binary film of boron and one other element onto a suitable substrate, comprising
    supplying into a chamber that contains the substrate a gaseous mixture of decaborane and another gas whose molecules contain at least one atom of said other element, wherein said other gas is provided at a partial pressure that is several times as high as the partial pressure of said decaborane; and
    energizing said gaseous mixture in the chamber sufficiently to disassociate said atoms from said molecules and to disassociate said boron atoms from the decaborane, which combine as said binary film on said substrate.

6. The process of claim 5 wherein said other gas is selected from the group consisting of $N_2$, $NH_3$, $PH_3$ and $AsH_3$.

7. The process of claim 5 wherein said other gas is selected from the group consisting of ketanes, silane, and germane.

8. A process for depositing a boron film onto a suitable substrate, comprising
    introducing into a chamber that contains said substrate decaborane gas, and
    energizing said decaborane gas at selected locations on said substrate sufficiently to disassociate the boron from the decaborane which deposits itself on said substrate at said selected locations.

9. The process of claim 8 wherein said energizing includes illuminating a predetermined pattern on said substrate using ultraviolet radiation.

10. The process of claim 1 wherein said energizing is carried out photolytically using direct writing on said substrate.

11. The process of claim 8 wherein said energizing is carried out photolytically using direct writing on said substrate.

12. The process of claim 8 wherein said suitable substrate is an N-type semiconductor and said boron that is deposited at said selected locations is effective as a dopant to create P-type regions therein.

* * * * *